United States Patent [19]
Das

[11] Patent Number: 5,329,261
[45] Date of Patent: Jul. 12, 1994

[54] FERROELECTRIC RF LIMITER

[76] Inventor: Satyendranath Das, 5415 Connecticut Ave. NW. #132, Washington, D.C. 20015

[21] Appl. No.: 70,738

[22] Filed: May 27, 1993

[51] Int. Cl.$^5$ .............................................. H01P 1/22
[52] U.S. Cl. .................................. 333/17.2; 505/703
[58] Field of Search ........................... 333/17.2, 81 A; 505/866, 700, 701, 703

[56] References Cited

U.S. PATENT DOCUMENTS 3,309,626 3/1967 Higgins ........................... 333/17.2 X

OTHER PUBLICATIONS

Cohn et al., *A High-Power Limiter*, IEEE Trans. on MTT, Jan. 1965, pp. 47–54 TK7800I23.
Horton et al., *A One-Ghz Ferroelectric Limiter*, IEEE Trans. on MTT, Sep. 1967, pp. 517-523 TK7800I23.

Primary Examiner—Paul Gensler

[57] ABSTRACT

The ferroelectric limiter utilizes the bias voltage dependent dielectric constant property of a ferroelectric material. A main transmission line having a length of two or more half wavelengths at the operating frequency is used. A branch line is connected at one half wavelength away from one end of the transmission line. The branch line presents a very high impedance on the main transmission line at a low level of signal. The branch line contains a ferroelectric material. As the signal level increases, the dielectric constant of the ferroelectric material in the branch line changes. This reduces the impedance presented by the branch line on the main transmission line reducing the impedance of the main transmission line and the resulting output of the limiter. As the signal level increases, the impedance presented by the branch line on the main transmission line becomes increasingly smaller, further reducing the output of the of the limiter. Two designs of the limiter are presented. The limiter can be a part of a monolithic microwave integrated circuit (MMIC). The conductive coatings of the limiter can be a film of a single crystal high Tc superconductor material. The upper frequency limit of the ferroelectric limiter is determined by the relaxation frequency of the ferroelectric material such as 95 GHz for Strontium Titanate.

10 Claims, 2 Drawing Sheets

FERROELECTRIC RF LIMITER

1. Field of Invention

The present invention relates to limiters of electromagnetic waves and more particularly to RF limiters.

2. In many fields of electronics, it is often necessary to limit the output signal level. Commercial semiconductor, ferrite type and tube type limiters are available.

Ferroelectric materials have a number of attractive properties. Ferroelectrics can handle high peak power. The average power handling capacity is governed by the dielectric loss of the material. They have low switching time (such as 100 nS). Some ferroelectrics have low losses. The permittivity of ferroelectrics is generally large, as such the device is small in size. The ferroelectrics are operated in the paraelectric phase i.e. slightly above the Curie temperature. The ferroelectric limiter can be made of thin films, and can be integrated with other monolithic microwave/RF devices. Inherently, they have a broad bandwidth. They have no low frequency limitation as in the case of ferrite devices. The high frequency operation is governed by the relaxation frequency, such as 95 GHz for strontium titanate, of the ferroelectric material. The loss of the ferroelectric RF limiter is low with ferroelectric materials with a low loss tangent. A number of ferroelectric materials are not subject to burnout.

Cavity type ferroelectric limiters capable of handling peak input power levels in excess of 25 kW with a small signal insertion loss of 0.5 dB have been built by M. Cohn and A. F. Eikenberg, "A High-Power Limiter", IEEE Trans., MTT-13, pp. 47-54, January 1965. The ferroelectric limiter developed by J. B. Horton and M. Donaldson, "A One-GHz Ferroelectric Limiter". IEEE Trans, MTT-15, No. 9, pp. 517-523, September 1967 uses a ferroelectric capacitor to resonate with an inductor across a quarter-wave branch line connected to the main line.

Depending on a trade-off studies in individual cases, the best type of limiter can be selected.

SUMMARY OF THE INVENTION

The general purpose of this invention is to provide a low loss limiter which embraces the advantages of similarly employed conventional devices such as semiconductor, ferrite and tube devices.

To attain this, the present invention contemplates the use of a main transmission line containing a low loss dielectric material. The output impedance is controlled by a branch line connected to the main line. The branch line contains a ferroelectric material, d.c. biased to a lower permittivity, whose permittivity is controlled by the level of input signal. At low signal levels, the branch line impinges a very high impedance on the output circuit of the main line. At higher signal levels, the permittivity of the ferroelectric material is increased impinging a lower impedance on the output circuit of the main line. This reduces the level of the output signal below the level of the input signal.

It is an object of this invention to provide a limiter which is capable of handling high peak and average power levels. Another object of this invention is to provide a limiter which can be integrated into the structure of microwave and millimeter wave monolithic integrated circuits.

These and other objectives are achieved in accordance with the present invention which comprises of a main RF transmission line two or more halfwavelengths long. A branch or stub line is connected one or more halfwavelengths from the output end.

In one embodiment, the branch line, one or more halfwavelengths long, is formed from a ferroelectric material, d.c. biased to a lower value of permittivity, whose permittivity is a function of the input signal level. At a low level of signal, the branch line impinges a very high impedance on the output end of the main transmission line. The input signal travels to the output with a low insertion loss. As the level of the input signal increases, the permittivity of the ferroelectric material increases decreasing the velocity of propagation through the branch line. The electrical length of the branch line is increased. The branch line impinges a finite impedance on the output end of the main line reducing its output signal below the level of the input signal. When the level of the input signal is high, the increase in the electrical length is a quarter-wavelength, the impedance impinged by the branch line on the output end of the main line is very small. As a result, level of the output signal is significantly reduced below the level of the input signal. To provide limiting at different levels of input signals, more than one branch line can be connected to the main line.

In a second embodiment, the first part of the branch line or stub is a halfwave low loss dielectric line. At the end of the branch line, a line of ferroelectric material, d.c. biased to a low permittivity, is connected. At the other end of the ferroelectric line, a low loss dielectric transmission line of appropriate length is connected providing an inductance. The other end of the dielectric line is connected to a large capacitor formed by the same ferroelectric material as used in the earlier section or by a dielectric material of high permittivity producing an RF short circuit. When the level of the input signal is low, the capacitance of the ferroelectric line resonates with the inductance producing a high impedance. This produces a high impedance across the output end of the main transmission line without reducing the output impedance and the level of the output signal significantly below the level of the input signal. As the level of the input signal increases, the permittivity and the capacitance of the ferroelectric line are increased. The branch line impinges a finite impedance on the output end of the main transmission line reducing the output impedance and the signal level below the level of the input signal.

The ferroelectric material could be a liquid ferroelectric material or a solid such as potassium-tantalum-niobate titanate.

With these and other objectives in view, as will hereinafter be more particularly pointed out in the appended claims, reference is now made to the following description taken in connection with accompanying diagrams.

Figure 1:
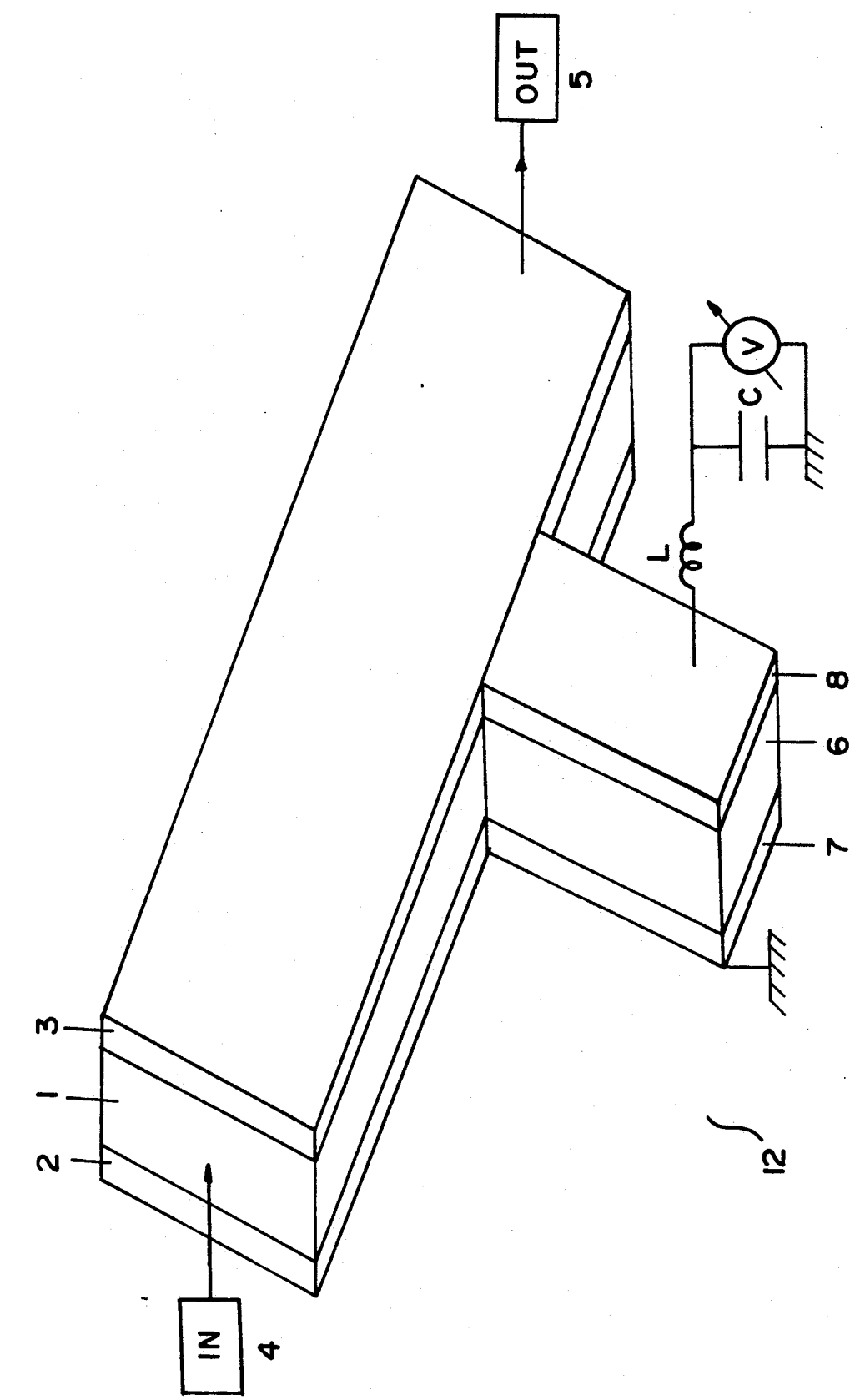
FIG. 1 is a pictorial, schematic diagram of a typical embodiment.

Referring now to the drawings, there is illustrated in FIG. 1 a typical micro-wave or millimeter wave circuit configuration that incorporates the principles of the present invention. Circuit 10 includes an RF input 4, an RF transmission line 12 and an RF output 5.

The circuit 10 might be part of a cellular, terrestrial, microwave, satellite, radio determination, radio navigation or other telecommunication system. The RF input 4 may represent a signal generator which launches a telecommunication signal onto a transmission line 12 for transmission and an output 5.

The ferroelectric RF limiter is made of the low loss dielectric material 1, two or more half-wavelengths long with conductive coatings on the top 3 and bottom 2 surfaces.

In addition to the main transmission line 1, the transmission line 12 contains at least one branch line 6, one or more half-wavelength(s) long, of a ferroelectric material which is d.c. biased to a lower value of permittivity. Conductive coatings are placed on top 8 and bottom 7 surfaces of the ferroelectric medium 6. At a very low level of signal, the branch line impinges a high impedance on the output end of the main transmission line and causes no impact on the signal flow. With the level of input signal increasing, the permittivity of the ferroelectric material is increased decreasing the wavelength and increasing the electrical length of the branch line. As a result, the branch line impinges decreasing impedance on the output end of the main transmission line impeding the signal flow. At a high level of the input signal when the electrical length of the branch line is increased by a quarter-wave, a very low impedance is presented by the branch line on the output end of the main transmission line significantly reducing the level of the output signal below the level of the input signal.

A d.c. voltage V is applied to the ferroelectric medium. The inductance L provides a high impedance to the RF energy. The capacitance C provides a short circuit path to any RF energy remaining after the inductance L.

Figure 2:
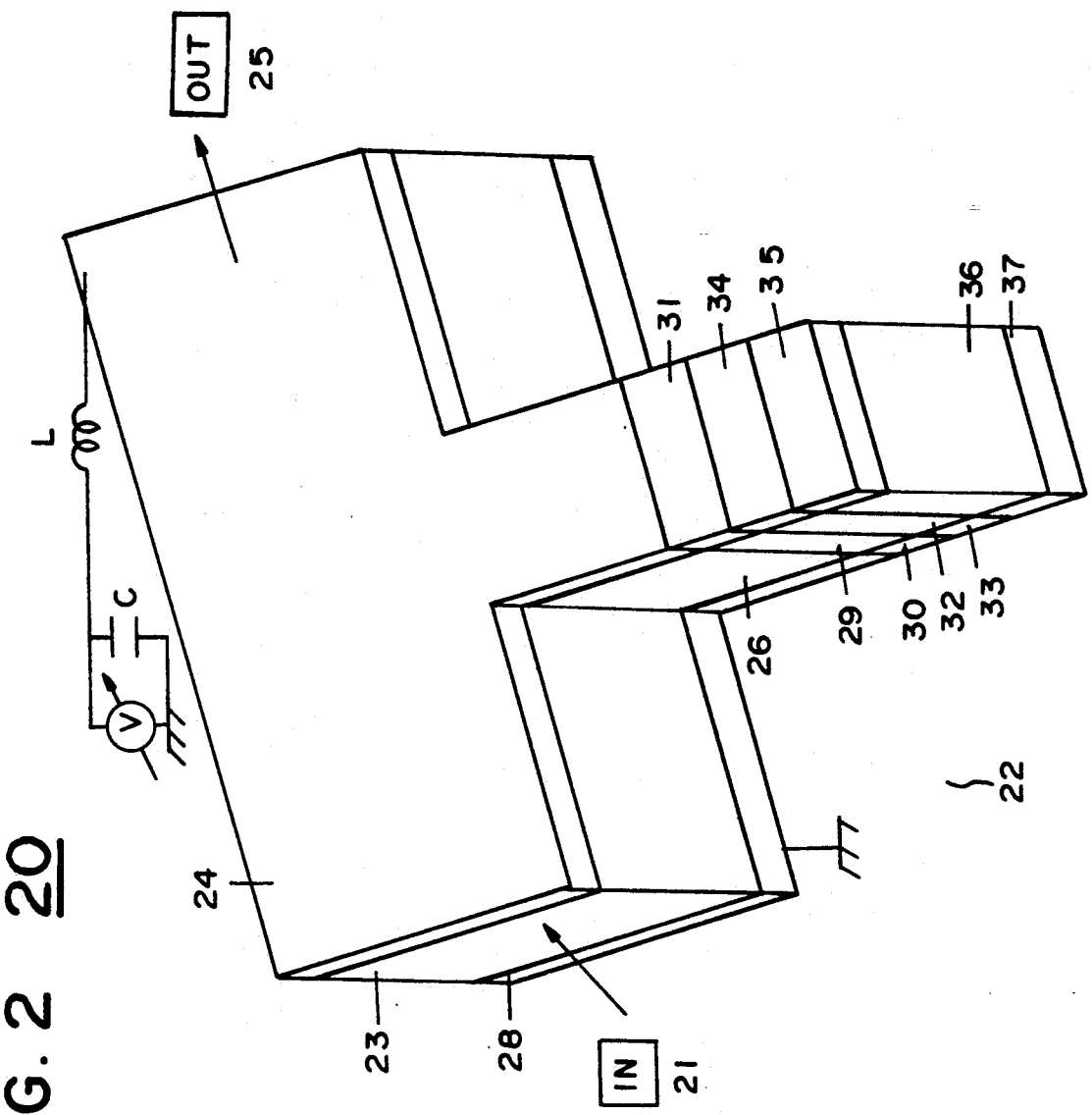
FIG. 2 is a pictorial schematic diagram of a second embodiment.

There is illustrated in FIG. 2 a second microwave or millimeter wave circuit configuration that incorporates the principles of the present invention. Circuit 20 includes an RF input 21, an RF transmission line 22 and an RF output 25.

The ferroelectric RF limiter is made of the low loss dielectric material 23, one wavelength long, with conductive coatings on top 24 and bottom 28 surfaces.

The transmission line 22 also contains a half-wave long branch or stub line 26 made of the same dielectric material as 23 and placed half-a-wavelength from the end and the beginning of the main transmission line. The top 24 and bottom 28 surfaces of the branch line 26 are coated with a conductive material. At the end of the branch line a ferroelectric medium 29, whose permittivity is a function of the electric field across it, is connected. The top 31 and bottom 30 surfaces of the ferroelectric medium 29 are coated with a conducting material. The ferroelectric medium is d.c. biased to a low value of permittivity. At the end of the ferroelectric medium 29, a short dielectric medium 32 of appropriate length is connected. The upper 34 and bottom 33 surfaces of the dielectric medium 32 are coated with a conductive material. The dielectric medium 32 forms an inductance.

At the end of the dielectric medium 32, a medium of ferroelectric, same as 29 or a low loss dielectric material of high permittivity is connected. The top 35 and bottom 37 surfaces of the ferroelectric or dielectric medium 36 is coated with a conductive material. The ferroelectric or dielectric medium 36 provides a high capacitance and a short circuit.

At a low level of the input signal the capacitance of the ferroelectric medium 29 and the inductance of the dielectric medium 32 form parallel resonance. At this level of the input signal, the branch line 26 impinges a very high impedance across the main transmission line 23 without significantly reducing the level of the output signal below the level of the input signal. As the level of the input signal 21 increases, the permittivity of the ferroelectric medium 29 and its capacitance increase. At high levels of signal, the ferroelectric medium forms a high capacitance and a very low impedance. As a result, the branch line impinges a low impedance on the main transmission line 23. The input signal 21 is transmitted to the output 25 with a very high loss.

The impedance of the branch line 26 can be adjusted to adjust the level of the input signal at which limiting will start.

A d.c. voltage V is applied to the ferroelectric medium. The inductance L provides a high impedance to the RF energy. The capacitance C provides a short circuit path to any RF energy remaining after the inductance L.

The limiter could be designed with no or a low d.c. bias.

In order to prevent undesired RF propagation modes and effects, the height and the width of the transmission line 12 and 22 need to be controlled.

The dielectric media and the active ferroelectric media, could be in thin film configurations.

A microstrip line configuration is shown in FIG. 1 and FIG. 2 as a discrete device. However, the same drawings will depict the ferroelectric room temperature or high Tc superconductor limiters in a monolithic microwave integrated circuit configuration as a part of a more comprehensive circuit. The conductive coatings are microstrip line conductors.

The limiters can also be configured in a waveguide structure.

It should be understood that the foregoing disclosure relates to only typical embodiments of the invention and that numerous modification or alternatives may be made therein without departing from the spirit and the scope of the invention as set forth in the appended claims.

What is claimed is:

1. A ferroelectric RF limiter having an input, output, a ground plane and comprising of:

a first body of a solid dielectric material, with a conductive coating on its top and bottom surfaces having a length of one wavelength at the operating frequency of the limiter and, forming a main transmission line;

a second body of a solid ferroelectric material, with a conductive coating on its top and bottom surfaces, having a length of one or more half wavelength(s) at the operating frequency of the limiter and, having a permittivity that is a function of an electric field in which it is immersed forming a branch or stub line and connected one half wavelength, at the operating frequency of the limiter, from one end of the main transmission line;

a first RF transmission means for coupling RF energy into said body;

a second RF transmission means for coupling RF energy from said body;

means for applying a d.c. bias electric field to adjust its initial operating point;

said conductive coatings being made of a film of a single crystal high Tc superconductor material; and means for keeping the limiter at the high superconducting Tc.

2. A ferroelectric RF limiter having an input, output, a ground plane and comprising of:

a first body of a solid dielectric material with a conductive coating on its top and bottom surfaces, having a length of one wavelength at the operating frequency of the limiter and forming a main transmission line;

a second body of a solid dielectric material, with a conductive coating on its top and bottom surfaces, half a wavelength long at the operating frequency of the limiter, forming a branch or stub line and connected one half wavelength from one end of the main transmission line;

a body of a ferroelectric material, with a conductive coating on its top and bottom surfaces, of appropriate length, whose permittivity changes with the electric field in which it is immersed, connected to the half-wavelength long dielectric said second body in the branch line forming a variable capacitor of a parallel resonant circuit;

a third body of a dielectric material, with a conductive coating on its top and bottom surfaces, of appropriate length connected to the said ferroelectric body in the branch line forming an inductance of a parallel resonant circuit;

a body of a ferroelectric or dielectric material of high permittivity, with a conductive coating on its top and bottom surfaces, and of appropriate length connected to the dielectric said third body in the branch line and effectively forming an RF short circuit;

means for applying a d.c. bias electric field to the limiter to adjust its initial operating point.

3. A ferroelectric RF limiter having an input, output a ground plane and comprising of:

a microstrip line on a first body of a dielectric material, having a length of one wavelength at the operating frequency of the limiter, forming a main transmission line;

a microstrip line on a body of a ferroelectric material, having a permittivity that is a function of the electric field in which it is immersed and one or more half-wavelength(s) long, forming a branch or stub line and connected one half wavelength, at the operating frequency of the limiter, from one end of the main transmission line;

means for applying a d.c. bias electric field to the limiter to adjust its initial operating point;

said microstrip lines being made of a film of a single crystal high Tc superconductor material; and means for keeping the limiter at the high superconducting Tc.

4. A ferroelectric RF limiter having an input, output, ground plane and comprising of:

a microstrip line, having a length of one wavelength at the operating frequency of the limiter, on a first body of a dielectric material forming a main transmission line;

a microstrip line on a second body of a dielectric material half a wavelength long at the operating frequency of the limiter, forming a branch or stub line and connected one half wavelength, at the operating frequency of the limiter, from one end of the main transmission line;

a microstrip line on a body of a ferroelectric material, whose permittivity changes with the electric field in which it is immersed, of appropriate length and connected to the halfwavelength long dielectric said second body microstrip line in the branch line forming a variable capacitor of a parallel resonant circuit;

a microstrip line on a third body of a dielectric material of appropriate length connected to the said microstrip line on the body of the said ferroelectric material in the branch line and forming an inductance of a parallel resonance circuit;

a microstrip line on a body of a ferroelectric or dielectric material, of high permittivity, connected to the said microstrip line of appropriate length on the third body of the dielectric material at the end of the branch line effectively forming an RF short circuit;

a conductive coating on the bottom side of the limiter forming a ground plane; and means for applying a d.c. bias electric field to the limiter to adjust its operating point.

5. A Ferroelectric limiter having an input, output, a ground plane and comprising of:

a microstrip line, one wavelength long at the operating frequency of the limiter, on a dielectric film forming a main transmission line;

a microstrip line on a ferroelectric film having a permittivity that is a function of the electric field in which it is immersed and one or more half-wavelength(s) long at the operating frequency of the limiter, forming a branch or stub line and connected one half wavelength from one end of the main transmission line;

a conductive coating on the bottom side of the limiter forming a ground plane; and means for applying a d.c. bias electric field to the limiter to adjust its initial operating point.

6. A ferroelectric limiter having an input, output, a ground plane and comprising of:

a first microstrip line, one wavelength long at the operating frequency of the limiter, on a dielectric film forming a main transmission line;

a second microstrip line on a dielectric film, half a wavelength long, at the operating frequency of the limiter, forming a branch or stub line and connected one half wavelength, at the operating frequency of the limiter, from one end of the main transmission line;

a third microstrip line, of appropriate length, on a body of a ferroelectric film, whose permittivity is a function of the electric field in which it is immersed, connected to the said second microstrip line forming the branch line forming a variable capacitor of a parallel resonant circuit;

a fourth microstrip line, of appropriate length, on a dielectric film connected to the said third microstrip line on the ferroelectric film of the branch line forming an inductance of a parallel resonant circuit;

a fifth microstrip line on a ferroelectric or dielectric film of high permittivity and connected to the said fourth microstrip line on the dielectric film at the end of the branch line effectively forming an RF short circuit;

a conductive coating on the bottom of the limiter forming a ground plane; and means for applying a d.c. bias electric field to the limiter to adjust its initial operating point.

7. A ferroelectric RF limiter comprising of:

each of the limiter of claims 1, 2, 3, or 4, wherein a ferroelectric liquid crystal (FLC) is used as the ferroelectric material.

8. A ferroelectric RF limiter comprising of:

each of the limiter of claims 2, 4, 5 or 6 wherein a high Tc superconductor material is used as the conductive coatings; and means for keeping the RF limiter at the high superconducting Tc 9. A ferroelectric RF limiter having an input, output, a ground plane and comprising of:

a first body of a solid dielectric material with a conductive coating on its to and bottom surfaces, having a length of one wavelength at the operating frequency of the limiter and forming a main transmission line;

a second body of a solid dielectric material, with a conductive coating on its top and bottom surfaces, half a wavelength long at the operating frequency of the limiter, forming a branch or stub line and connected one half wavelength from one end of the main transmission line;

a body of a ferroelectric liquid crystal (FLC) material, with a conductive coating on its top and bottom surfaces, of appropriate length, whose permittivity changes with the electric field in which it is immersed, connected to the half-wavelength long dielectric said second body in the branch line forming a variable capacitor of a parallel resonant circuit;

a third body of a dielectric material, with a conductive coating on its top and bottom surfaces, of appropriate length connected to the said ferroelectric body in the branch line forming an inductance of a parallel resonant circuit;

a body of a ferroelectric or dielectric material of high permittivity, with a conductive coating on its top and bottom surfaces, and of appropriate length connected to the dielectric said third body in the branch line and effectively forming an RF short circuit;

said conductors being made of a single crystal high Tc superconductor;

means for applying a d.c. bias electric field to the limiter to adjust its initial operating point; and means for keeping the limiter at a high superconducting Tc.

10. A ferroelectric RF limiter having an input, output, ground plane and comprising of:

a microstrip line, having a length of one wavelength at the operating frequency of the limiter, on a first body of a dielectric material forming a main transmission line;

a microstrip line on a second body of a dielectric material half a wavelength long at the operating frequency of the limiter, forming a branch or stub line and connected one half wavelength, at the operating frequency of the limiter, from one end of the main transmission line;

a microstrip line on a body of a ferroelectric liquid crystal (FLC) material, whose permittivity changes with the electric field in which it is immersed, of appropriate length and connected to the half-wavelength long dielectric said second body microstrip line in the branch line forming a variable capacitor of a parallel resonant circuit;

a microstrip line on a third body of a dielectric material of appropriate length connected to the said microstrip line on the body of the said ferroelectric material in the branch line and forming an inductance of a parallel resonance circuit;

a microstrip line on a body of a ferroelectric or dielectric material, of high permittivity and of appropriate length, connected to the said microstrip line on the third body of the dielectric material at the end of the branch line effectively forming an RF short circuit;

a conductive coating on the bottom side of the limiter forming a ground plane;

said microstrip lines being made of a single crystal high Tc superconductor;

means for applying a d.c. bias electric field to the limiter to adjust its operating point; and means for keeping the limiter at the high superconducting temperature.

* * * * *